United States Patent
Sung et al.

(10) Patent No.: US 9,419,218 B2
(45) Date of Patent: *Aug. 16, 2016

(54) RESISTANCE VARIABLE MEMORY STRUCTURE AND METHOD OF FORMING THE SAME

(71) Applicant: Taiwan Semiconductor Manufacturing Company, Ltd., Hsin-Chu (TW)

(72) Inventors: Fu-Ting Sung, Yangmei (TW);
Ching-Pei Hsieh, Kaohsiung (TW);
Chia-Shiung Tsai, Hsin-Chu (TW);
Chern-Yow Hsu, Chu-Bei (TW);
Shih-Chang Liu, Alian Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/720,823

(22) Filed: May 24, 2015

(65) Prior Publication Data

US 2015/0255713 A1 Sep. 10, 2015

Related U.S. Application Data

(63) Continuation of application No. 14/015,738, filed on Aug. 30, 2013, now Pat. No. 9,040,951.

(51) Int. Cl.
*H01L 47/00* (2006.01)
*H01L 45/00* (2006.01)

(52) U.S. Cl.
CPC ............ *H01L 45/1253* (2013.01); *H01L 45/08* (2013.01); *H01L 45/122* (2013.01); *H01L 45/146* (2013.01); *H01L 45/16* (2013.01); *H01L 45/1608* (2013.01); *H01L 45/1666* (2013.01)

(58) Field of Classification Search
CPC ............ H01L 45/1233; H01L 45/124; H01L 45/1246; H01L 45/1253; H01L 45/146; H01L 45/1683

USPC .......................................................... 257/4, 3
See application file for complete search history.

(56) References Cited

U.S. PATENT DOCUMENTS

| | | | |
|---|---|---|---|
| 5,831,276 A | 11/1998 | Gonzalez et al. | |
| 8,637,843 B2 | 1/2014 | Asano | |
| 9,040,951 B2 * | 5/2015 | Sung .................. | H01L 45/1253 257/3 |
| 2004/0012009 A1 | 1/2004 | Casagrande et al. | |
| 2012/0007032 A1 | 1/2012 | Lee et al. | |
| 2012/0097916 A1 * | 4/2012 | Tada ..................... | H01L 27/101 257/4 |
| 2012/0211715 A1 | 8/2012 | Asano | |
| 2012/0267598 A1 * | 10/2012 | Sakotsubo ........ | H01L 21/02183 257/4 |

FOREIGN PATENT DOCUMENTS

JP 2012174827 9/2012
KR 101094987 12/2011

* cited by examiner

*Primary Examiner* — Tu-Tu Ho
(74) *Attorney, Agent, or Firm* — Slater Matsil, LLP

(57) ABSTRACT

A memory structure includes a first dielectric layer, having a first top surface, over a conductive structure. A first opening in the first dielectric layer exposes an area of the conductive structure, and has an interior sidewall. A first electrode structure, having a first portion and a second portion, is over the exposed area of the conductive structure. The second portion extends upwardly along the interior sidewall. A resistance variable layer is disposed over the first electrode. A second electrode structure, having a third portion and a fourth portion, is over the resistance variable layer. The third portion has a second top surface below the first top surface of the first dielectric layer. The fourth portion extends upwardly along the resistance variable layer. A second opening is defined by the second electrode structure. At least a part of a second dielectric layer is disposed in the second opening.

20 Claims, 4 Drawing Sheets

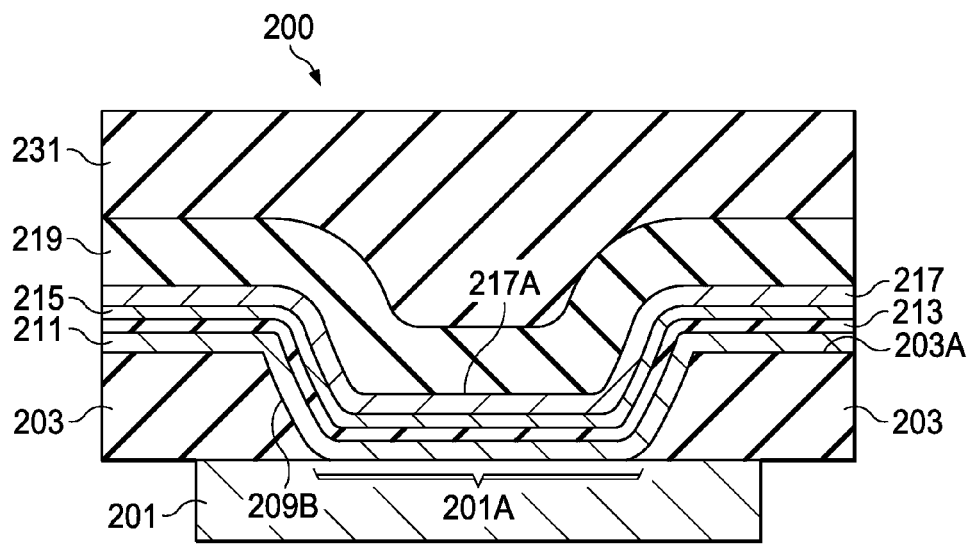
FIG. 2C
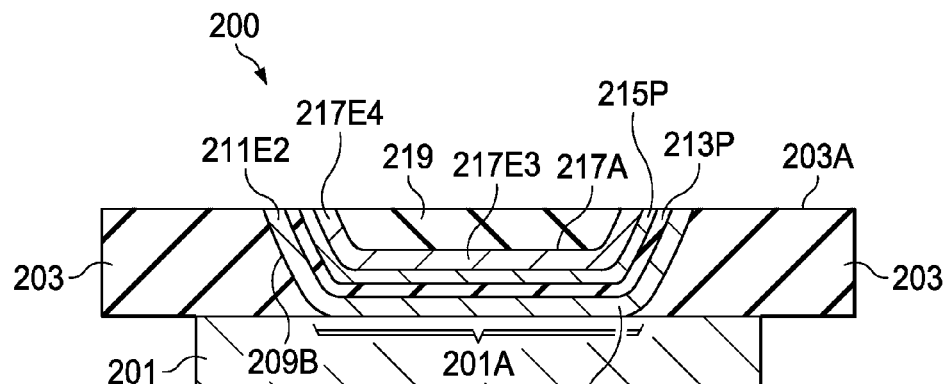
FIG. 2D$_1$
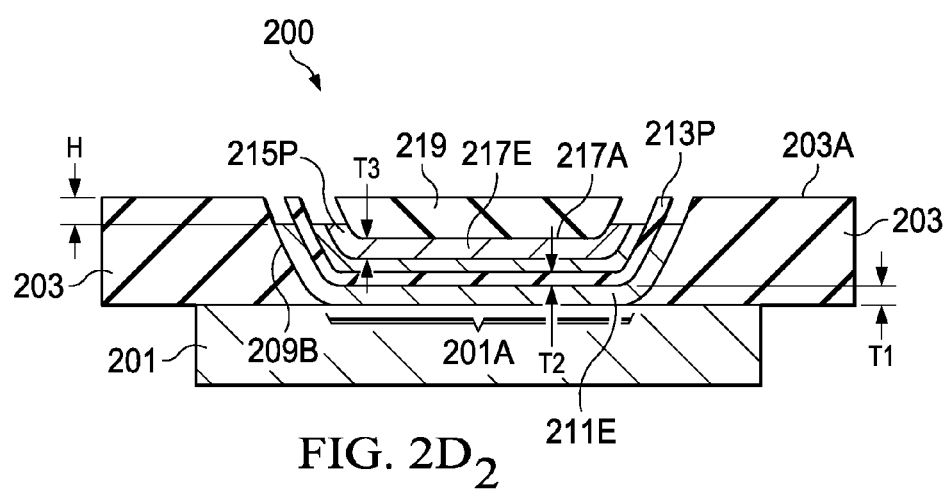
FIG. 2D$_2$

RESISTANCE VARIABLE MEMORY STRUCTURE AND METHOD OF FORMING THE SAME

This application is a continuation application of, and claims priority to, U.S. patent application Ser. No. 14/015, 738, now U.S. Pat. No. 9,040,951, entitled "Resistance Variable Memory Structure And Method Of Forming The Same," filed on Aug. 30, 2013, which application is incorporated herein by reference.

TECHNICAL FIELD

This disclosure relates generally to a semiconductor structure and, more particularly, to a resistance variable memory structure and method of forming a resistance variable memory structure.

BACKGROUND

In integrated circuit (IC) devices, resistive random access memory (RRAM) is an emerging technology for next generation non-volatile memory devices. Generally, RRAM typically use a dielectric material, which although normally insulating can be made to conduct through a filament or conduction path formed after application of a specific voltage. Once the filament is formed, it may be set (i.e., re-formed, resulting in a lower resistance across the RRAM) or reset (i.e., broken, resulting in a high resistance across the RRAM) by appropriately applied voltages. The low and high resistance states can be utilized to indicate a digital signal of "1" or "0" depending upon the resistance state, and thereby provide a non-volatile memory cell that can store a bit.

From an application point of view, RRAM has many advantages. RRAM has a simple cell structure and CMOS logic compatible processes which result in a reduction of the manufacturing complexity and cost in comparison with other non-volatile memory structures. Despite the attractive properties noted above, a number of challenges exist in connection with developing RRAM. Various techniques directed at configurations and materials of these RRAMs have been implemented to try and further improve device performance.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

FIGS. 2A to 2F are cross-sectional views of a resistance variable memory structure at various stages of manufacture according to one or more embodiments of the method of FIG. 1.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

According to one or more embodiments of this disclosure, at least one resistance variable memory structure is formed within a semiconductor chip region of a substrate. A plurality of semiconductor chip regions is marked on the substrate by scribe lines between the chip regions. The substrate will go through a variety of cleaning, layering, patterning, etching and doping steps to form the semiconductor structures. The term "substrate" herein generally refers to a bulk semiconductor substrate on which various layers and device structures are formed. In some embodiments, the bulk substrate includes silicon or a compound semiconductor, such as GaAs, InP, Si/Ge, or SiC. Examples of the layers include dielectric layers, doped layers, polysilicon layers or conductive layers. Examples of the device structures include transistors, resistors, and/or capacitors, which may be interconnected through an interconnect layer to additional integrated circuits.

Figure 1:
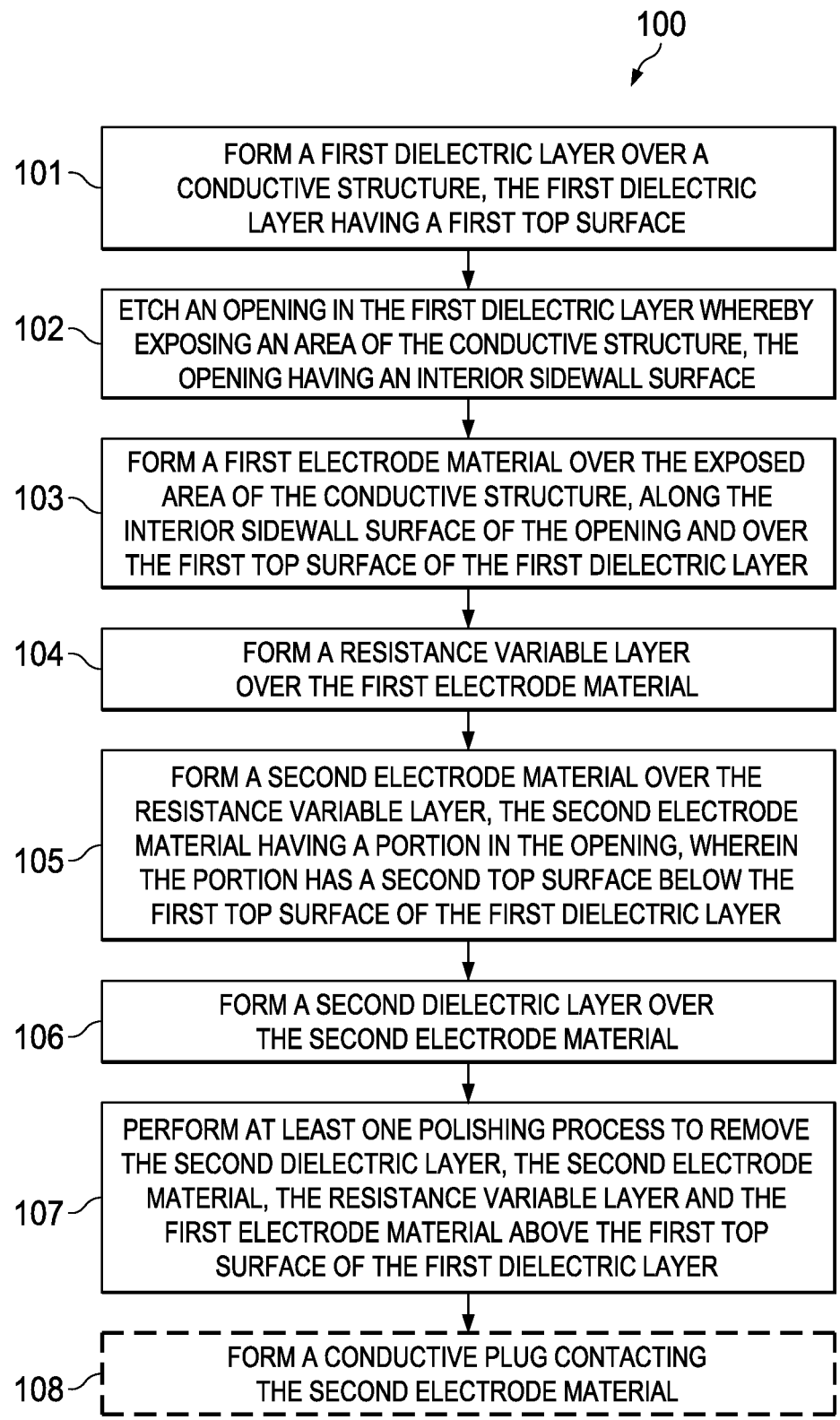
FIG. 1 is a flowchart of a method of forming a resistance variable memory structure according to at least one embodiment of this disclosure.

FIG. 1 is a flowchart of a method 100 of forming a resistance variable memory structure according to at least one embodiment of this disclosure. FIGS. 2A to 2F are cross-sectional views of a resistance variable memory structure 200 at various stages of manufacture according to various embodiments of the method 100 of FIG. 1. Additional processes may be provided before, during, or after the method 100 of FIG. 1. Various figures have been simplified for a better understanding of the inventive concepts of the present disclosure.

Referring now to FIG. 1, the flowchart of the method 100 begins with operation 101. A first dielectric layer is formed over a conductive structure. The first dielectric layer has a first top surface. The first dielectric layer includes a substantially oxygen-free dielectric material such as silicon carbide or silicon nitride. In some embodiments, the conductive structure is embedded in an insulating layer formed over a substrate. The insulating layer may include multiple insulating layers.

Figure 2A:
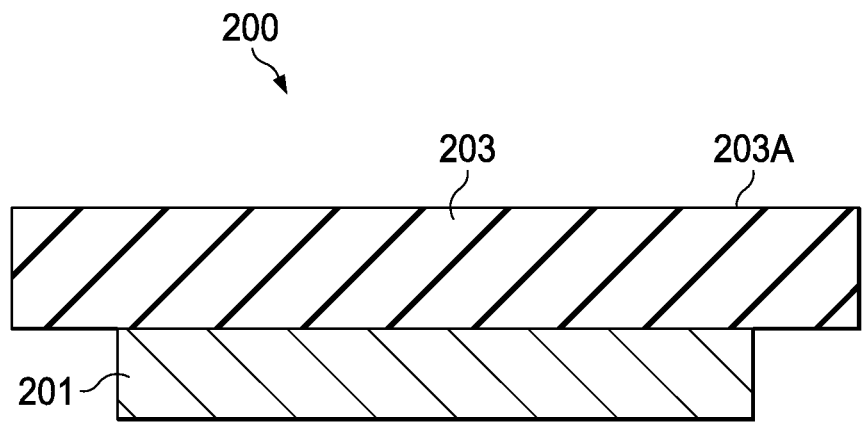

Referring to FIG. 2A, which is an enlarged cross-sectional view of a portion of a resistance variable memory structure 200 after performing operation 101. The resistance variable memory structure 200 includes a conductive structure 201 formed over a substrate (not shown) such as a silicon carbide (SiC) substrate, GaAs, InP, Si/Ge or a silicon substrate. In some embodiments, the substrate includes an insulating layer (not shown) formed over a top surface of the substrate. The insulating layer comprises silicon oxide, fluorinated silica glass (FSG), carbon doped silicon oxide, tetra-ethyl-ortho-silicate (TEOS) oxide, phosphosilicate glass (PSG), boro-phosphosilicate glass (BPSG), Black Diamond® (Applied Materials of Santa Clara, Calif.), amorphous fluorinated carbon, low-k dielectric material, or combinations thereof.

The conductive structure 201 is formed embedded in the insulating layer. In certain embodiments, the conductive structure 201 includes a conductive interconnect, a doped region or a silicide region. In some embodiments, the conductive structure 201 includes Al, Cu, Ti, Ta, W, Mo, TaN, NiSi, CoSi, TiN, WN, silicon or combinations thereof. In the illustrated example of FIG. 2A, the conductive structure 201 may be formed by lithography patterning and etching in the insulating layer. A metal layer deposition and planarization processes are performed over the insulating layer to form the conductive structure 201. A top surface of the conductive structure 201 is substantially coplanar with a top surface the insulating layer.

Still referring to FIG. 2A, a first dielectric layer 203 is formed over the conductive structure 201. The first dielectric layer 203 has a first top surface 203A. The first dielectric layer 203 may prevent the conductive structure 201 from being oxidized. In certain embodiments, the first dielectric layer 203 includes a substantially oxygen-free dielectric material such as silicon carbide or silicon nitride. The first dielectric layer 203 may also protect conductive paths between the following formed first electrode structure and second electrode structure, and may enhance the electrical characteristic stability for the resistance variable memory structure 200. A further explanation will be provided below. The formation process may include chemical vapor deposition (CVD), atomic layer deposition (ALD) or plasma enhanced CVD (PECVD).

Referring back to FIG. 1, method 100 continues with operation 102. In operation 102, an opening is etched in the first dielectric layer that exposes an area of the conductive structure. The opening has an interior sidewall surface.

Figure 2B:
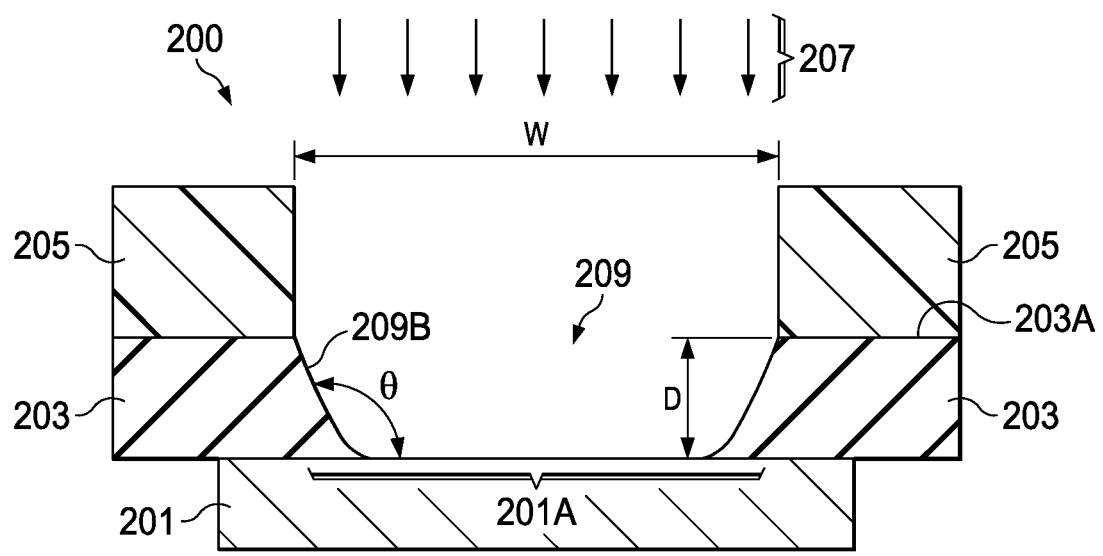

Referring to FIG. 2B, which is a cross-sectional view of the resistance variable memory structure 200 after performing operation 102. In at least one embodiment, a photo resist coating and a lithography patterning are performed over the first dielectric layer 203. A patterned mask layer 205 (e.g. photo resist layer) is formed on the first top surface 203A and a hole in the patterned mask layer 205 exposes a part of the first dielectric layer 203. An etching process 207 is performed to remove the part of the first dielectric layer 203. A first opening 209 is formed in first dielectric layer 203 and exposes an area 201A of the conductive structure 201. The opening 209 has an interior sidewall surface 209B. The first opening 209 has an interior angle θ between a plane parallel to a top surface of the area 201A and the interior sidewall surface 209B. In certain examples, the interior angle θ is in a range from about 92° to about 135°. In some embodiments, process parameters such as gas ratio and bias power are adjusted to control the sidewall interior angle θ. The interior angle θ within the above range improves the step coverage of the following first electrode material 211 deposition, prevents the first electrode material 211 tending to overhang at the top corner of the first opening 201 and may enhance the electrical characteristic stability for the resistance variable memory structure 200.

The first opening 209 has a height D from the top surface of the area 201A to first top surface 203A of the first dielectric layer 203, and a width W parallel to the top surface of the area 201A. In some examples, an aspect ratio D/W of the first opening 209 is in a range from about 0.3 to about 1. A further description will be provided below in the text related to FIG. $2D_1$.

The patterned mask layer 205 is removed after forming the first opening 209.

Referring back to FIG. 1, method 100 continues with operations 103 to 106. In operation 103, a first electrode material is formed over the exposed area of the conductive structure, along the interior sidewall surface of the opening and over the first top surface of the first dielectric layer. The opening is partially filled with the first electrode material. A portion of the first electrode material over the exposed area has a top surface below the first top surface of the first dielectric layer. In operation 104, a resistance variable layer is formed over the first electrode material. In operation 105, a second electrode material is formed over the resistance variable layer. The second electrode material has a portion in the opening. The portion has a second top surface below the first top surface of the first dielectric layer. In operation 106, a second dielectric layer is formed over the second electrode material. In some embodiments, the operations 103 to 106 are performed in a same mainframe (i.e. piece of processing equipment) with different process chambers without exposure to an external environment, such as air, from the operation 103 to operation 106.

Referring to FIG. 2C, which is a cross-sectional view of the resistance variable memory structure 200 after performing operations 103 to 106. A first electrode material 211 is formed over the exposed area 201A of the conductive structure 201, along the interior sidewall surface 209B of the first opening 209 and over the first top surface 203A of the first dielectric layer 203. The first electrode material 211 includes a conductive material having an appropriate work function such that a high work function wall is built between the first electrode material 211 and a subsequently formed resistance variable layer 213. The first electrode material 211 may comprise Pt, AlCu, TiN, Au, Ti, Ta, TaN, W, WN, Cu or combinations thereof. In certain embodiments, the first electrode material 211 has a thickness $T_1$ in a range from about 150 Å to 350 Å.

In certain examples, the first electrode material 211 is deposited by atomic layer deposition (ALD). The first electrode material 211 may be a conformal layer and a thickness variation ratio of the thickest portion to thinnest portion in a range from 1 to 3 has been found to have beneficial effects of conformity. In some embodiments, formation methods for the first electrode material 211 include sputtering or PVD.

A resistance variable layer 213 is formed over the first electrode material 211. The resistance variable layer 213 has a resistivity capable of switching between a high resistance state and a low resistance state (or conductive), by application of an electrical voltage. In various embodiments, the resistance variable layer 213 includes at least one of dielectric materials comprising a high-k dielectric material, a binary metal oxide and a transition metal oxide. In some embodiments, the resistance variable layer 213 includes nickel oxide, titanium oxide, hafnium oxide, zirconium oxide, zinc oxide, tungsten oxide, aluminum oxide, tantalum oxide, molybdenum oxide or copper oxide. The resistance variable layer 213 has a thickness $T_2$ in a range from about 20 Å to 150 Å. In some embodiments, the resistance variable layer 213 is conformally deposited over the first electrode material 211 by ALD. A thickness variation ratio of the thickest portion to thinnest portion in a range from 1 to 3 has been found to have beneficial effects of conformity. In some embodiments, formation methods for the resistance variable layer 213 include pulse laser deposition (PLD).

Still referring to FIG. 2C, a metal cap layer 215 optionally is formed on the resistance variable layer 213. The metal cap layer 215 includes a first metal material that is capable of depriving oxygen from the resistance variable layer 213, or that creates vacancy defects in the resistance variable layer 213. The metal cap layer 215 comprises at least one of titanium, platinum or palladium.

A second electrode material 217 is deposited over the resistance variable layer 213 (and on the metal cap layer 215 if the metal cap layer 215 exists). The second electrode material 217 may include suitable conductive materials to electrically connect a subsequently formed interconnect structure for electrical routing for the resistance variable memory structure 200. The second electrode material 217 may comprise Pt, AlCu, TiN, Au, Ti, Ta, TaN, W, WN, Cu or combinations thereof. In certain embodiments, the second electrode material 217 has a thickness $T_3$ in a range from about 150 Å to 350 Å. The first opening 209 becomes a shallower second opening (not shown) after second electrode material 217 is formed. A portion of the second electrode material 217 in the first opening 209 has a second top surface 217A below the first top surface 203A of the first dielectric layer 203. The second electrode material 217 may be a conformal layer and a thickness variation ratio of the thickest portion to thinnest portion in a range from 1 to 3 has been found to have beneficial effects of conformity. The formation methods for the second electrode material 217 include ALD, sputtering, or PVD.

Still referring to FIG. 2C, a second dielectric layer 219 is formed over the second electrode material 217 filing the second opening. In certain embodiments, the second dielectric layer 219 includes a substantially oxygen-free dielectric material such as silicon carbide or silicon nitride. The second dielectric layer 219 may protect conductive paths between the following formed first electrode structure and second electrode structure, and may enhance the electrical characteristic stability for the resistance variable memory structure 200. The formation process may include chemical vapor deposition (CVD), atomic layer deposition (ALD) or plasma enhanced CVD (PECVD).

In some embodiments, the resistance variable memory structure 200 further includes a sacrificial layer 231 formed over the second dielectric layer 219 to a level above the first top surface 203A of the first dielectric layer 203. The sacrificial layer 231 includes an oxide layer or other suitable materials which have less etching or polishing resistance compared to the second dielectric layer 219. Advantageously, the sacrificial layer 231 fills the second opening surrounded by second dielectric layer 219 and reduces topographic differences among the resistance variable memory structure 200 shown in FIG. 2C and provides for a smooth new surface. The sacrificial layer 231 enhances the capability of generating a smooth planarized second dielectric layer 219 by the following polishing process.

Referring back to FIG. 1, method 100 continues with operation 107. In operation 107, at least one polishing process is performed to remove the second dielectric layer, the second electrode material, the resistance variable layer and the first electrode material above the first top surface of the first dielectric layer.

FIG. 2D$_1$ is a cross-sectional view of the resistance variable memory structure 200 for certain embodiments after performing operation 107. At least one chemical mechanical polishing (CMP) process is performed to remove the sacrificial layer 231, a portion of the second dielectric layer 219, a portion of the second electrode material 217, a portion of the resistance variable layer 213 and a portion of the first electrode material 211. The first top surface 203A of the first dielectric layer 203 is exposed. A resistive random access memory (RRAM) cell is formed over the exposed area 201A of the conductive structure 201 and along the interior sidewall surface 209B of the first opening 209. The planarized second dielectric layer 219 is disposed in a top section of the first opening 209.

The RRAM cell includes a first electrode structure 211E, a resistance variable layer 213P and a second electrode structure 217E. A metal cap layer 215P is optionally formed between the resistance variable layer 213P and the second electrode structure 217E. The first electrode structure 211E has a first portion 211E$_1$ and an integrally connected second portion 211E$_2$. The first portion 211E$_1$ is over the exposed area 201A of the conductive structure 201. The second portion 211E$_2$ extends upwardly along the interior sidewall surface 209B of the first opening 209. The resistance variable layer 213P is disposed over the first electrode structure 211E. The second electrode structure 217E has a third portion 217E$_3$ and an integrally connected fourth portion 217E$_4$. The third portion 217E$_3$ has the second top surface 217A below the first top surface 203A of the first dielectric layer 203. The fourth portion 217E$_4$ extends upwardly along the resistance variable layer 213P. The second opening (not shown) is defined by the third portion 217E$_3$ and the fourth portion 217E$_4$ of the second electrode structure 217E. The planarized second dielectric layer 219 is disposed in the second opening (also the top section of the first opening 209). An edge region of resistance variable layer 213P, an edge region of the second portion 211E$_2$ of the first electrode structure 211E and an edge region of the fourth portion 217E$_4$ of the second electrode structure 217E are substantially coplanar to the first top surface 203A of the first dielectric layer 203. An edge region of the RRAM cell does not protrude out of the top surface 203A of the first dielectric layer 203.

This paragraph continues to the previous discussion about the aspect ratio D/W of the first opening 209 in FIG. 2B. If the aspect ratio D/W is less than 0.3, the first opening 209 may be too shallow for the second dielectric layer 219. The second dielectric layer 219 may be completely removed by the least one CMP process. There may be no planarized second dielectric layer 219 left in the top section of the first opening 209. There may be no protection for the third portion 217E$_3$ and the fourth portion 217E$_4$ of the second electrode structure 217E. If the aspect ratio D/W is larger than 1, a combined layer which includes the first electrode material 211, the resistance variable layer 213, the second electrode material 217, the second dielectric layer 219 and the sacrificial layer 231 tends to overhang at the top corner of the first opening 201. The electrical characteristic stability for the resistance variable memory structure 200 may degrade.

Referring to FIG. 2D$_2$, which is a cross-sectional view of the resistance variable memory structure 200 for some embodiments after performing operation 107. Similar to the RRAM cell shown in FIG. 2D$_1$, the RRAM cell shown in FIG. 2D$_2$ includes the first electrode structure 211E, the resistance variable layer 213P and the second electrode structure 217E. However, a further etching process is performed to pull back top surfaces of the second portion 211E$_2$ and the fourth portion 217E$_4$. An edge region of resistance variable layer 213P protrudes with a height H out of an edge region of the first electrode structure 211E and an edge region of the second electrode structure 217E. In certain embodiments, the height H is more than twice of the thickness T$_2$ of the resistance variable layer 213P. With protrusions of resistance variable layer 213P, the first electrode structure 211E and the second electrode structure 217E are isolated from each other. There is no residual conductive material of the first electrode structure 211E or the second electrode structure 217E on surfaces of the RRAM cell. Hence, possible leakage paths are eliminated and the resistance variable memory structure 200 may have better electrical characteristic stability.

Figure 2E:
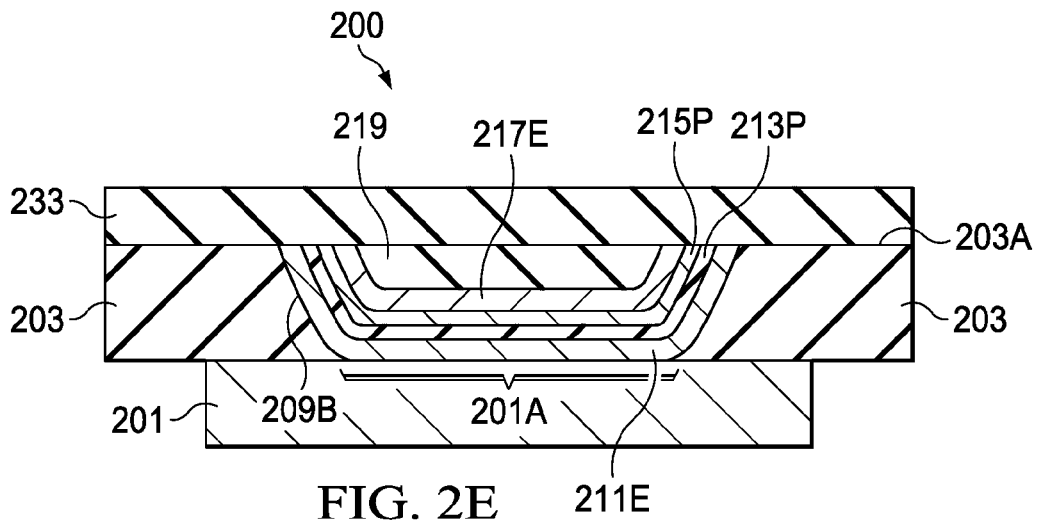

Referring to FIG. 2E, which is a cross-sectional view of the resistance variable memory structure 200 after forming an insulating layer 233 over FIG. 2D$_1$. The following discussion could equally apply to the embodiment illustrated in FIG. 2D$_2$. The insulating layer 233 may protect the first electrode structure 211E and the second electrode structure 217E been disturbed by environments during various operations for data storage. In certain embodiments, the insulating layer 233 includes a substantially oxygen-free dielectric material such as silicon carbide or silicon nitride. In some embodiments, the insulating layer 233 and the second dielectric layer 219 are a same dielectric material.

Referring back to FIG. 1, method 100 optionally continues with operation 108. In operation 108, a conductive plug is formed and contacts the second electrode material.

Figure 2F:
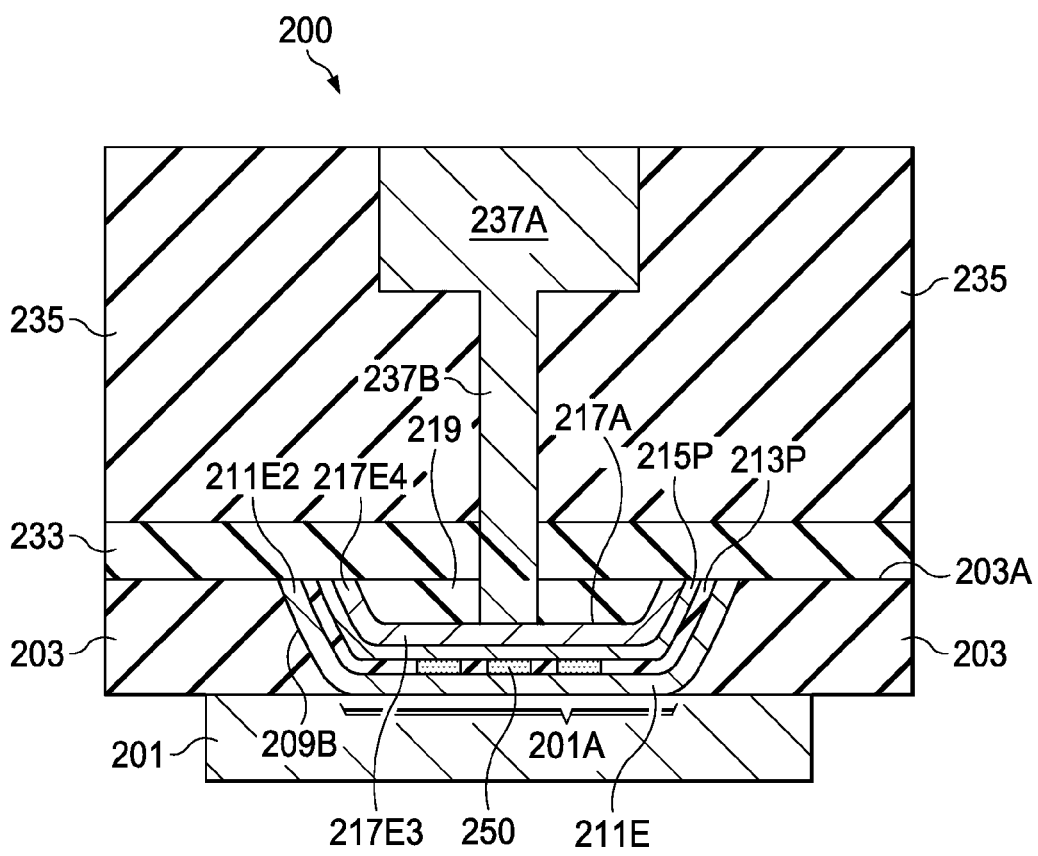

FIG. 2F is a cross-sectional view of the resistance variable memory structure 200 after performing operation 108. An inter-metal dielectric (IMD) layer 235 may be blanket formed over insulating layer 233 shown in FIG. 2E. The IMD layer 235 may include multiple dielectric layers. The IMD layer 223 may comprise silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, or combinations thereof.

In certain embodiments, a dual damascene process is performed in the IMD layer 235 to form a conductive wire 237A and an integrally connected conductive plug 237B. The conductive plug 237B contacts the third portion $217E_3$ of the second electrode structure 217E. A conductive material of the conductive wire 237A and the conductive plug 237B includes copper, copper alloys, aluminum or tungsten.

FIG. 2F also illustrates the resistance variable memory structure 200 in various operations for data storage. In a "forming" operation, a "forming" voltage is applied to the first and second electrodes 211E and 217E, respectively. The "forming" voltage is high enough to generate a conductive portion in the resistance variable layer 213P between the first electrode 211E and the second electrode 217E. In one example, the conductive portion includes one or more conductive filaments 250 to provide a conductive path such that the conductive portion of the resistance variable layer 213P shows an "on" or low resistance state. The conductive path may be related to the lineup of the defect (e.g. oxygen) vacancies in the conductive portion of the resistance variable layer between the first portion $211E_1$ and the third portion $217E_3$. In some embodiments, the "forming" voltage is applied only one time. Once the conductive path is formed, the conductive path will remain present in the conductive portion of the resistance variable layer 213P. Other operations (reset operation and set operation) may disconnect or reconnect the conductive path using smaller voltages or different voltages.

Advantageously, the first dielectric layer 203, the second dielectric layer 219 and the insulating layer 233 include one or more substantially oxygen-free dielectric materials. The layers 203, 219 and 233 surround the RRAM cell. The layers 203, 219 and 233 may prevent the lineup of the defect (e.g. oxygen) vacancies for conductive paths 250 in the resistance variable layer 213P from being disturbed by oxygen atoms from adjacent layers. In this disclosure, the RRAM cell is defined in operation 107 with a CMP process. This disclosure eliminates possible plasma damage to the RRAM cell formed by plasma dry etching processes. The electrical characteristic stability and reliability for the resistance variable memory structure 200 are enhanced by various embodiments of this disclosure.

One aspect of the disclosure describes a memory structure. The memory structure includes a first dielectric layer over a conductive structure. The first dielectric layer has a first top surface. A first opening is in the first dielectric layer and exposes an area of the conductive structure. The first opening has an interior sidewall surface. A first electrode has a first portion and an integrally connected second portion. The first portion is over the exposed area of the conductive structure. The second portion extends upwardly along the interior sidewall surface of the first opening. A resistance variable layer is disposed over the first portion and the second portion of the first electrode. A second electrode is over the resistance variable layer. The second electrode had a third portion and an integrally connected fourth portion. The third portion has a second top surface below the first top surface of the first dielectric layer. The fourth portion extends upwardly along the resistance variable layer. A second opening is defined by the third portion and the fourth portion of the second electrode. At least a part of a second dielectric layer is disposed in the second opening.

A further aspect of the disclosure describes a memory structure. The memory structure includes a first dielectric layer having a top surface and an opening with an interior sidewall surface. At least a part of a second dielectric layer is disposed in a top section of the opening. A resistive random access memory (RRAM) cell is disposed between the interior sidewall surface of the opening and the second dielectric layer. The RRAM cell includes a first electrode, a resistance variable layer and a second electrode. The first electrode is disposed in a bottom section of the opening and extends upwardly along the interior sidewall surface of the opening. The resistance variable layer is disposed over the first electrode. A second electrode is disposed over the resistance variable layer and contacts at least a part of the second dielectric layer. An edge region of the RRAM cell does not protrude out of the top surface of the first dielectric layer.

The present disclosure also describes an aspect of a method of forming a resistance variable memory structure. The method includes a first dielectric layer formed over a conductive structure. The first dielectric layer has a top surface. An opening is etched in the first dielectric layer and exposes an area of the conductive structure. The opening has an interior sidewall surface. A first electrode material is formed over the exposed area of the conductive structure, along the interior sidewall surface of the opening and over the first top surface of the first dielectric layer. A resistance variable layer is formed over the first electrode material. A second electrode material is formed over the resistance variable layer. The second electrode material has a portion in the opening. The portion has a second top surface below the first top surface of the first dielectric layer. A second dielectric layer is formed over the second electrode material. At least one polishing process is performed to remove the second dielectric layer, the second electrode material, the resistance variable layer and the first electrode material above the first top surface of the first dielectric layer.

In an embodiment, a memory element is provided. The memory element includes a first dielectric layer over a conductive structure, the first dielectric layer having a first top surface. The first dielectric layer includes a first opening extending to the conductive structure, the first opening having an interior sidewall surface. A first electrode in the first opening in the first dielectric layer, wherein the first electrode extends from a bottom of the first opening on to sidewalls of the first opening. A resistance variable layer is disposed over the first electrode, the resistance variable layer extending from the first electrode along the bottom of the first opening on to the first electrode that extends onto the sidewalls of the first opening. A second electrode structure is over the resistance variable layer.

In yet another embodiment, a method of forming a resistance variable memory element is provided. The method includes forming a first dielectric layer over a conductive structure, the first dielectric layer having a first top surface, and etching an opening in the first dielectric layer thereby exposing an area of the conductive structure, the opening having an interior sidewall surface. A first electrode material is deposited over the exposed area of the conductive structure, along the interior sidewall surface of the opening and over the first top surface of the first dielectric layer. A resistance variable layer is deposited over the first electrode material, and a second electrode material is deposited over the resistance variable layer. The second electrode material has a portion in the opening, wherein the portion has a second top surface below the first top surface of the first dielectric layer. A second dielectric layer is formed over the second electrode material, and at least one polishing process is performed to remove the second dielectric layer, the second electrode material, the resistance variable layer and the first electrode material above the first top surface of the first dielectric layer.

In yet still another embodiment a method of forming a resistance variable memory element is provided. The method includes forming a first dielectric layer over a conductive structure of a substrate, the first dielectric layer having a first top surface, and etching an opening in the first dielectric layer thereby exposing an area of the conductive structure, the opening having an interior sidewall surface. A first electrode material is deposited over the exposed area of the conductive structure, along the interior sidewall surface of the opening and over the first top surface of the first dielectric layer, and a resistance variable layer comprising a high-K dielectric material, a binary metal oxide and a transition metal oxide is deposited. A second electrode material is deposited over the resistance variable layer, the second electrode material having a portion in the opening, wherein the portion has a second top surface below the first top surface of the first dielectric layer, and a second dielectric layer is formed over the second electrode material, wherein the second dielectric layer comprises silicon nitride and/or silicon carbide and is substantially oxygen free. At least one polishing process is performed to remove the second dielectric layer, the second electrode material, the resistance variable layer and the first electrode material above the first top surface of the first dielectric layer, and a contact to the second electrode material is formed.

Although the embodiments and its advantages have been described in detail, it should be understood that various changes, substitutions and alterations can be made herein without departing from the spirit and scope of the invention as defined by the appended claims. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed:

1. A memory element comprising:
a first dielectric layer over a conductive structure, the first dielectric layer having a first top surface;
a first opening in the first dielectric layer extending to the conductive structure, the first opening having an interior sidewall surface;
a first electrode in the first opening in the first dielectric layer, wherein the first electrode extends from a bottom of the first opening on to sidewalls of the first opening;
a resistance variable layer disposed over the first electrode, the resistance variable layer extending from the first electrode along a bottom of the first opening on to the first electrode that extends along the sidewalls of the first opening; and
a second electrode over the resistance variable layer.

2. The memory element of claim 1, wherein the sidewalls have an interior angle in a range of about 92° to about 135'.

3. The memory element of claim 1, further comprising an electrical contact in contact with the second electrode.

4. The memory element of claim 1, wherein the resistance variable layer comprises a high-k dielectric material, a binary metal oxide or a transition metal oxide.

5. The memory element of claim 1, wherein the resistance variable layer is selectively configurable to form at least one conductive path between the first electrode and the second electrode.

6. The memory element of claim 1, wherein a surface of the resistance variable layer, a surface of the first electrode, and a surface of the second electrode are substantially coplanar to the first top surface of the first dielectric layer.

7. The memory element of claim 1, wherein the first dielectric layer is substantially oxygen-free.

8. A method of forming a resistance variable memory element, the method comprising:
forming a first dielectric layer over a conductive structure, the first dielectric layer having a first top surface;
etching an opening in the first dielectric layer thereby exposing an area of the conductive structure, the opening having an interior sidewall surface;
depositing a first electrode material over the exposed area of the conductive structure, along the interior sidewall surface of the opening, and over the first top surface of the first dielectric layer;
depositing a resistance variable layer over the first electrode material;
depositing a second electrode material over the resistance variable layer, the second electrode material having a portion in the opening, wherein the portion has a second top surface below the first top surface of the first dielectric layer;
forming a second dielectric layer over the second electrode material; and
performing at least one polishing process to remove the second dielectric layer, the second electrode material, the resistance variable layer, and the first electrode material from above the first top surface of the first dielectric layer.

9. The method as in claim 8, wherein the first electrode material is selected from the group of Pt, AlCu, TiN, Au, Ti, Ta, TaN, W, Wn, Cu and combinations thereof.

10. The method as in claim 9, wherein the first electrode material is deposited using atomic layer deposition.

11. The method as in claim 8, wherein the resistance variable layer selected from the group of nickel oxide, aluminum oxide, tantalum oxide, molybdenum oxide or copper oxide.

12. The method as in claim 11, wherein the resistance variable layer is deposited using pulsed laser deposition.

13. The method as in claim 8, wherein the second electrode material is selected from the group of Pt, AlCu, TiN, Au, Ti, Ta, TaN, W, Wn, Cu and combinations thereof.

14. The method as in claim 13, wherein the first electrode material is deposited using one of atomic layer deposition, sputtering or physical vapor deposition.

15. The method as in claim 8, wherein the second dielectric layer comprises silicon nitride or silicon carbide.

16. The method as in claim 15, wherein the second dielectric layer is deposited using atomic layer deposition, chemical vapor deposition or plasma enhanced chemical vapor deposition.

17. The method as in claim 8, wherein the second dielectric layer is substantially oxygen free.

18. The method as in claim 8, wherein the at least one polishing process is chemical-mechanical polishing.

19. A method of forming a resistance variable memory element, the method comprising:
forming a first dielectric layer over a conductive structure of a substrate, the first dielectric layer having a first top surface;

etching an opening in the first dielectric layer, thereby exposing an area of the conductive structure, the opening having an interior sidewall surface;

depositing a first electrode material over the exposed area of the conductive structure, along the interior sidewall surface of the opening, and over the first top surface of the first dielectric layer;

depositing a resistance variable layer comprising a high-K dielectric material, a binary metal oxide, and a transition metal oxide;

depositing a second electrode material over the resistance variable layer, the second electrode material having a portion in the opening, wherein the portion has a second top surface below the first top surface of the first dielectric layer;

forming a second dielectric layer over the second electrode material, wherein the second dielectric layer comprises silicon nitride and/or silicon carbide and is substantially oxygen free;

performing at least one polishing process to remove the second dielectric layer, the second electrode material, the resistance variable layer, and the first electrode material from above the first top surface of the first dielectric layer; and forming a contact to the second electrode material.

20. The method as in claim 19 wherein the second dielectric layer is substantially oxygen free.

* * * * *